(12) United States Patent
Blish et al.

(10) Patent No.: US 6,362,524 B1
(45) Date of Patent: Mar. 26, 2002

(54) EDGE SEAL RING FOR COPPER DAMASCENE PROCESS AND METHOD FOR FABRICATION THEREOF

(75) Inventors: Richard C. Blish, Saratoga; Kurt O. Taylor, San Jose, both of CA (US); David C. Greenlaw, Dresden (DE)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/625,367

(22) Filed: Jul. 26, 2000

(51) Int. Cl.$^7$ .............................. H01L 23/48
(52) U.S. Cl. ............... 257/734; 257/736; 257/776; 257/775; 438/687
(58) Field of Search ................ 257/734–776; 438/703, 761, 782, 783, 790, 978, 694

(56) References Cited

U.S. PATENT DOCUMENTS 5,723,385 A * 3/1998 Shen et al. ............... 438/763

* cited by examiner

*Primary Examiner*—Chandra Chaudhari
*Assistant Examiner*—Yennhu B. Huynh
(74) *Attorney, Agent, or Firm*—Paul J. Winters

(57) ABSTRACT

A metal edge seal ring is formed in a trench made up of a large number of short, connected legs in perpendicular relation. Metal is deposited in the trench, and because the metal is comprised of many short segments rather than several long, straight sections, the subsequent chemical-mechanical polishing step does not cause significant cupping of the metal in the trench.

15 Claims, 8 Drawing Sheets

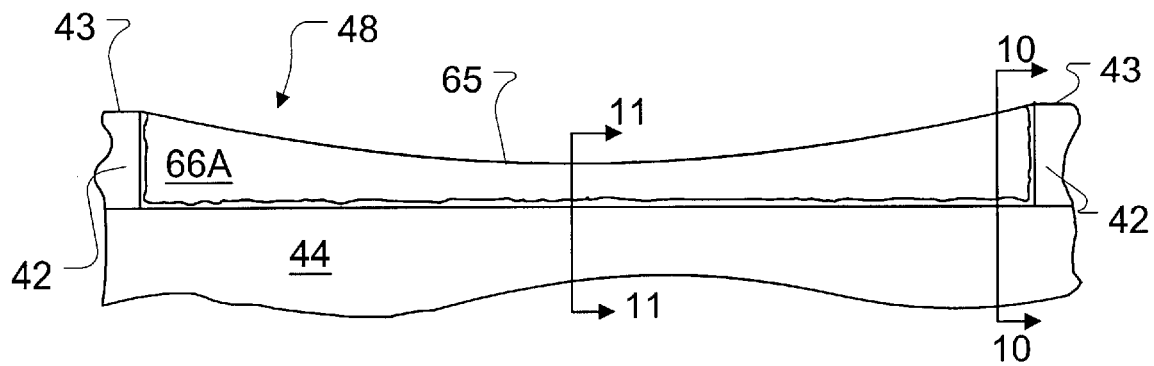
FIGURE 9    (PRIOR ART)
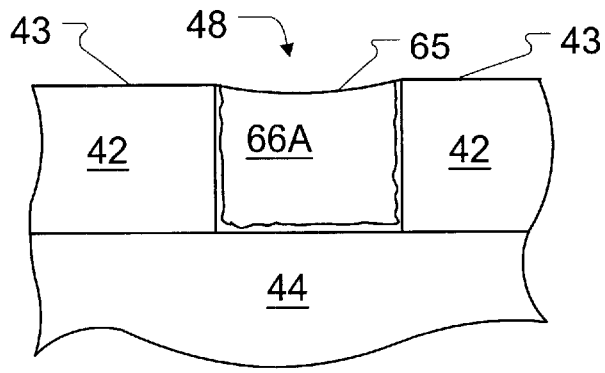
FIGURE 10    (PRIOR ART)
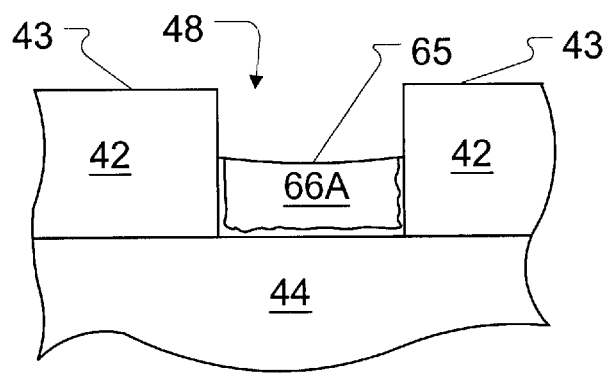
FIGURE 11    (PRIOR ART)

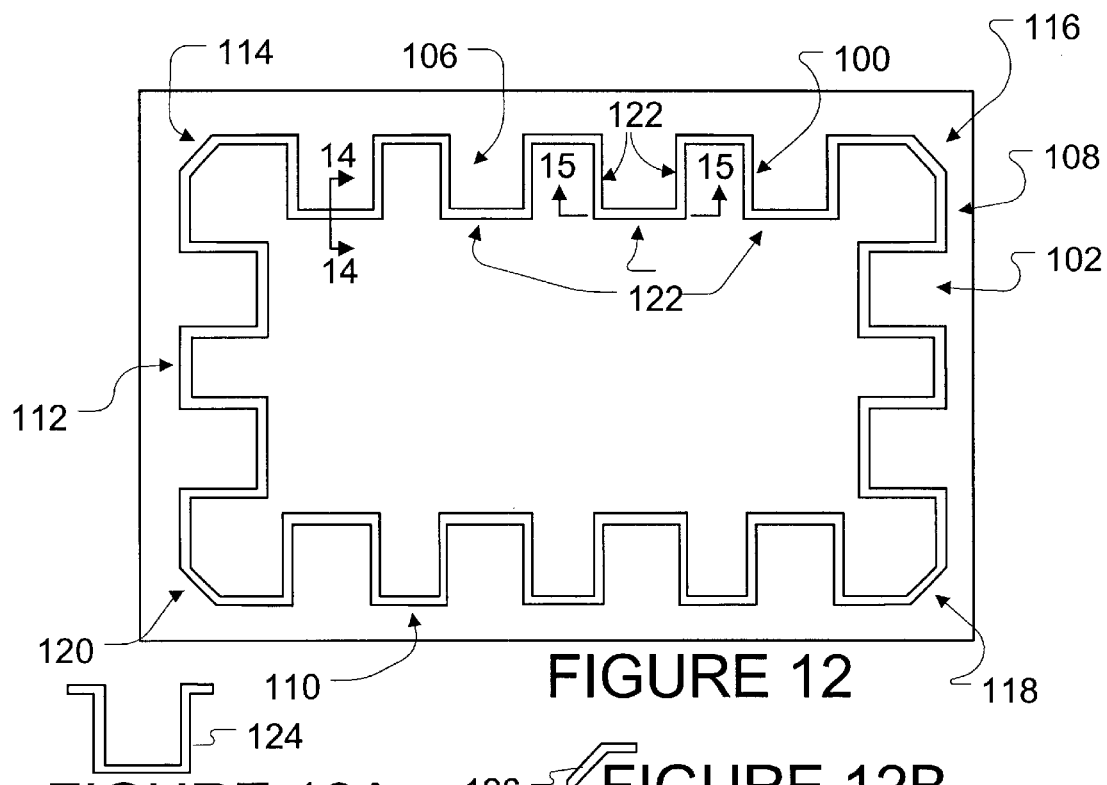
FIGURE 12
FIGURE 12A
FIGURE 12B
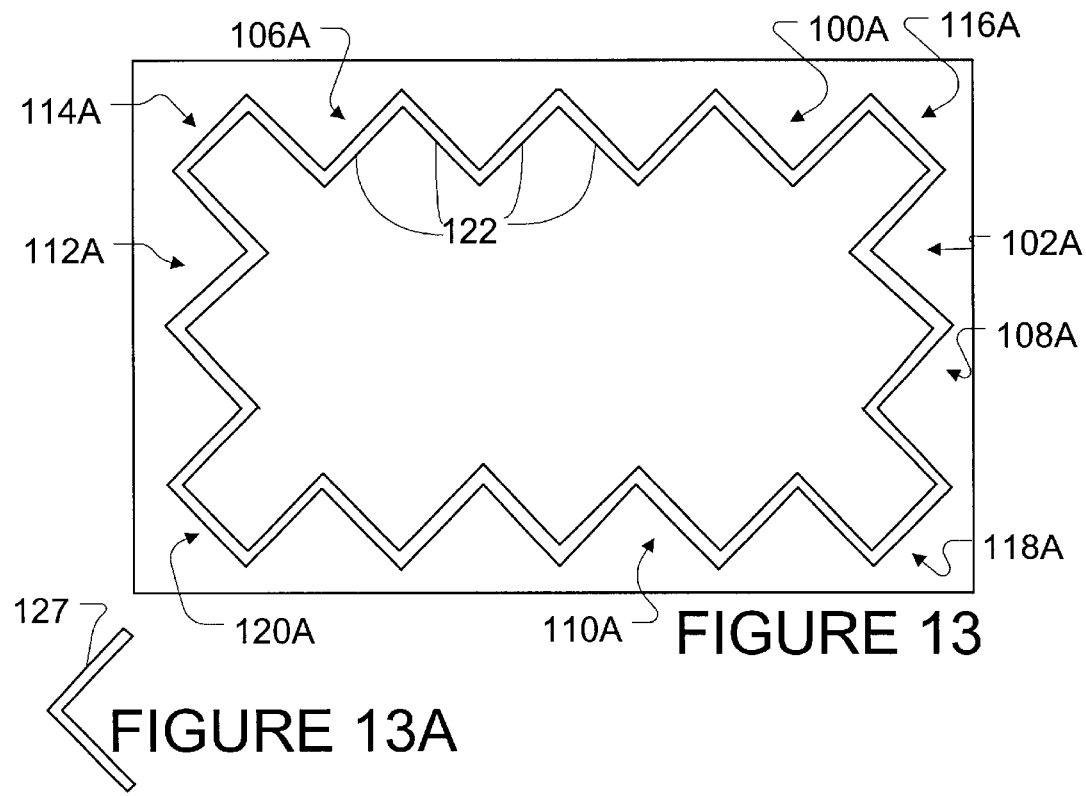
FIGURE 13
FIGURE 13A

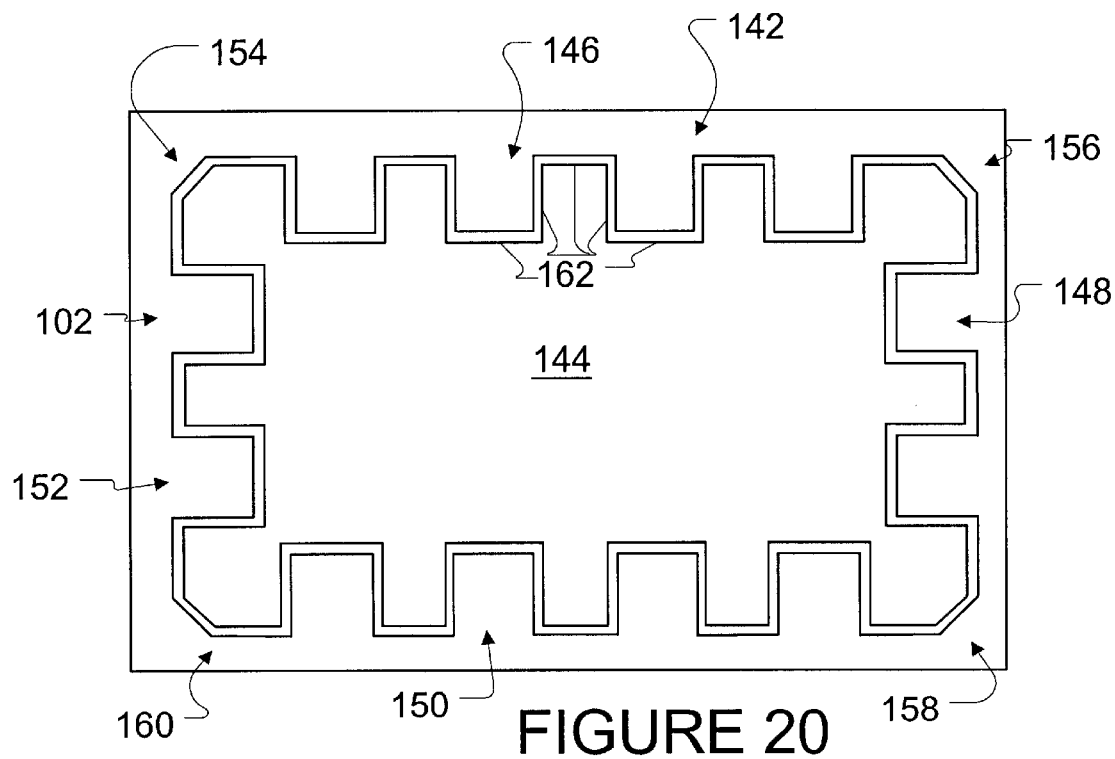
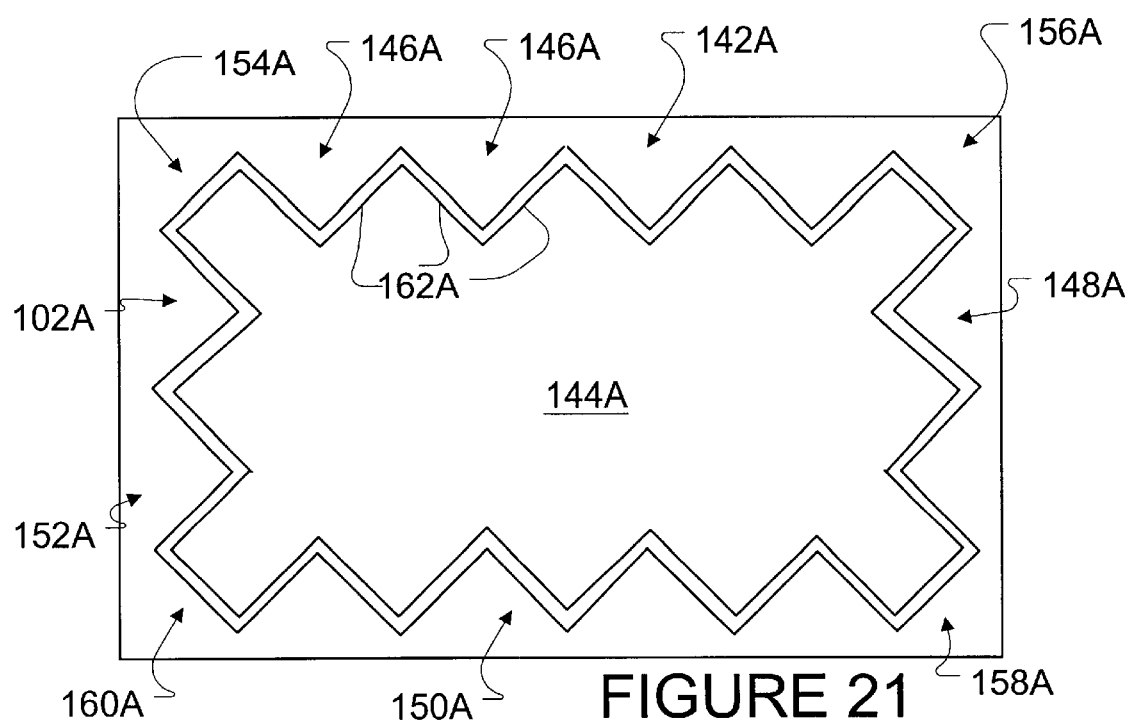

US 6,362,524 B1

EDGE SEAL RING FOR COPPER DAMASCENE PROCESS AND METHOD FOR FABRICATION THEREOF

BACKGROUND OF THE INVENTION

1. Field of the Invention

This invention relates generally to edge sealing for a semiconductor device, and more particularly, to an improved method for manufacturing an edge seal ring in a copper dual inlaid process, and the device produced thereby.

2. Discussion of the Related Art

The copper dual inlaid or dual damascene process is optimized for the formation of an array of small vias, which connect layers of metal separated by dielectric. With reference to FIG. 1, in the formation of such a via, a dielectric layer 20 is provided over a metal layer 22, and an opening 24 is provided in the dielectric layer 20 exposing a portion of the metal layer 22. After deposition of a diffusion barrier layer 26 such as tantalum or titanium nitride, copper 28 is deposited over the resulting structure, overfilling the opening 24 and having portions overlying the dielectric layer 20.

Next, a chemical-mechanical polishing step is undertaken. In such chemical-mechanical polishing process, as is well-known (FIG. 1), a wafer is mounted on a rotating platen, an independently rotating polishing pad 30 is pressed against the wafer surface 32, and a slurry 34 carrying small abrasive particles, usually colloidal, is flowed onto the platen. The particles attack and remove small pieces of the wafer surface 32 which are carried away by the movement of the slurry 34 across the surface 32. Furthermore, a slurry chemistry is selected that dissolves or etches surface materials. The combined actions of the two rotations with the slurry provide for effective chemical-mechanical polishing of the wafer surface 32, commonly known as planarization.

During such chemical-mechanical polishing, the metal is removed from the dielectric layer 20 and the level of copper 28A in the opening 24 is generally brought down to the level of the upper surface 36 of the dielectric layer 20 (FIGS. 2 and 3), so that the resulting upper surface 29 of the copper 28 is substantially coplanar with the upper surface 36 of the dielectric layer 20, forming an overall substantially planar surface ready for application of the next metal layer thereover.

Typically, the polishing pad 30 is made of somewhat compliant material, so that it is able to form itself generally to the surface 34 to be chemically-mechanically polished, meanwhile providing the greatest pressure on the highest surface area, so that as such polishing proceeds, surface planarity is achieved.

Such a polishing operation has proven effective in the formation of vias, which measure for example 0.2 μm by 0.2 μm. In via formation (FIGS. 2 and 3), the high (projecting) surfaces of the metal on the dielectric layer 20 are chemically-mechanically polished away first. Then, chemical-mechanical polishing proceeds until all metal is removed from the upper surface 36 of the dielectric layer 20 and the upper surface 29 of the copper via 28A in the opening 24 is generally coplanar with the upper surface 36 of the dielectric layer 20.

Even though pad 30 has a degree of flexibility, the upper surface 29 of the copper 28A in the opening 24 is substantially coplanar with the upper surface 36 of the dielectric layer 20, i.e., "dishing" of the copper (depression at center) is minimal. This is so because of the small dimensions as described above, i.e., the span across which the polishing pad 30 must extend in polishing the copper, from one edge of the dielectric to the other across the opening 24, is very small, for example 0.2 μm as stated above.

However, in forming an edge seal ring for a device, i.e., typically a rectangular metal ring around the active area of the device, which metal ring contacts a lower silicon layer to form a seal therewith for keeping contaminants from entering the active area, a significant problem arises. Typically, in the dual inlaid process, the metal ring is formed in the same general manner as are the vias discussed above. That is (FIGS. 4–6), an opening in the form of a rectangular trench 40 is formed in a dielectric layer 42 overlying a silicon layer 44. The trench 40 surrounds an active device area 46, and includes four long, straight, continuous trench portions 48, 50, 52, 54, connected by trench corner regions 56, 58, 60, 62.

After deposition of a barrier layer 64 over the structure, copper 66 is deposited in the trench 40 and chemical-mechanical polishing is undertaken as described above. A long trench portion 48 with barrier metal 64 and copper 66 therein is shown in FIGS. 7 and 8.

During chemical-mechanical polishing, the polishing pad 68 is brought into contact with the exposed surface 70 of the copper 66, and the higher portions thereof will be removed first. Chemical-mechanical polishing continues until the pad 68 is brought into contact with the edges of the dielectric layer 42 adjacent the trench portion 48. Because the portion 48 of the trench 40 is quite long, for example, 10 mm, and for example 1 μm wide, such dimensions, coupled with the compliant nature of the pad 68, cause a substantial degree of "dishing" or "cupping" to occur in the upper surface 65 of the copper 66A as shown in FIG. 9. That is, near the dielectric layer 42 edge adjacent the trench portion 48 (FIG. 10), the upper surface 65 of the copper 66 and upper surface 43 of the dielectric layer 42 are substantially coplanar, because the pad 68, even though compliant, is supported in that area by the edge of the dielectric layer 42. Meanwhile, in the center of the span, distant from the edges of the dielectric layer 42 (FIG. 11), removal of the copper will be significantly greater. That is, the vertical dimension (thickness) of the copper 66A above the silicon layer 44 at that point is much less than it is adjacent the dielectric. This lack of planarity can clearly lead to problems during the further fabrication of the device. Furthermore, a trench portion 48 of such significant length has proven difficult to fill with copper 66 as is needed for device reliability.

Therefore, what is needed is a method for forming an edge seal ring in a semiconductor device, which avoids the problem of dishing or cupping of the top surface of the ring during its fabrication, meanwhile being properly functional and promoting device reliability.

SUMMARY OF THE INVENTION

In the present invention, a trench in the general form of a continuous ring is provided in a dielectric layer overlying a silicon layer, the trench defining a continuous opening communicating with the silicon layer. The trench has elongated trench portions connected by trench corner regions. The elongated portions of the trench are each configured to include a plurality of connected legs of substantially the same length, positioned perpendicular to each other. After deposition of a diffusion barrier layer in the trench, metal such as copper or copper alloy is deposited in the trench. A chemical-mechanical polishing step is undertaken. The metal in the trench takes the general form of a continuous ring and is comprised of a plurality of elongated sections connected by corner regions. Each elongated section is made up of a plurality of connected segments, positioned in precise linear (perpendicular in the preferred embodiments) relationship. By forming the ring in short sections, the problem of cupping of the metal during chemical-mechanical polishing is avoided.

The present invention is better understood upon consideration of the detailed description below, in conjunction with the accompanying drawings. As will become readily apparent to those skilled in the art from the following description, there is shown and described embodiments of this invention simply by way of the illustration of the best mode to carry out the invention. As will be realized, the invention is capable of other embodiments and its several details are capable of modifications and various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as said preferred mode of use, and further objects and advantages thereof, will best be understood by reference to the following detailed description of illustrative embodiments when read in conjunction with the accompanying drawings, wherein:

FIG. 9 is a sectional view similar to that shown in FIG. 7, illustrating a further step in the chemical-mechanical polishing process;

FIG. 10 is a sectional view taken along the line 10—10 of FIG. 9;

FIG. 11 is a sectional view taken along the line 11—11 of FIG. 10;

FIG. 12 is a plan view of a device incorporating the present invention, illustrating a first configuration of the trench;

FIG. 12A is a plan view of a repeating cell used to build a substantial portion of the trench of FIG. 12;

FIG. 12B is a plan view of a repeating cell used to build the remaining portions of the trench of FIG. 12;

FIG. 13 is a plan view of a device incorporating the present in invention, illustrating a second configuration of the trench;

FIG. 20 is a plan view similar to that shown in FIG. 12, illustrating the configuration of a first embodiment of inventive seal edge ring; and FIG. 21 is a plan view similar to that shown in FIG. 13, illustrating the configuration of a second embodiment of the inventive sealing ring.

DETAILED DESCRIPTION

Reference is now made in detail to specific embodiments of the present invention which illustrate the best mode presently contemplated by the inventors for practicing the invention.

Figure 14:
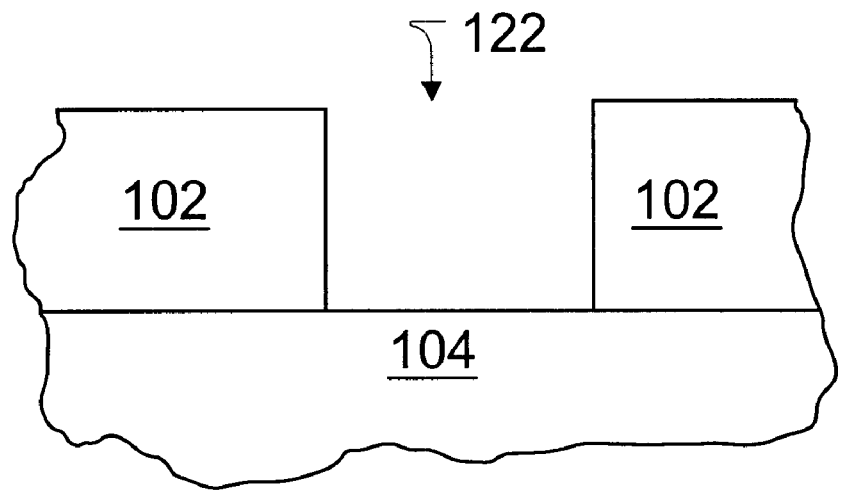
FIG. 14 is a sectional view taken along the line 14—14 of FIG. 12.
Figure 15:
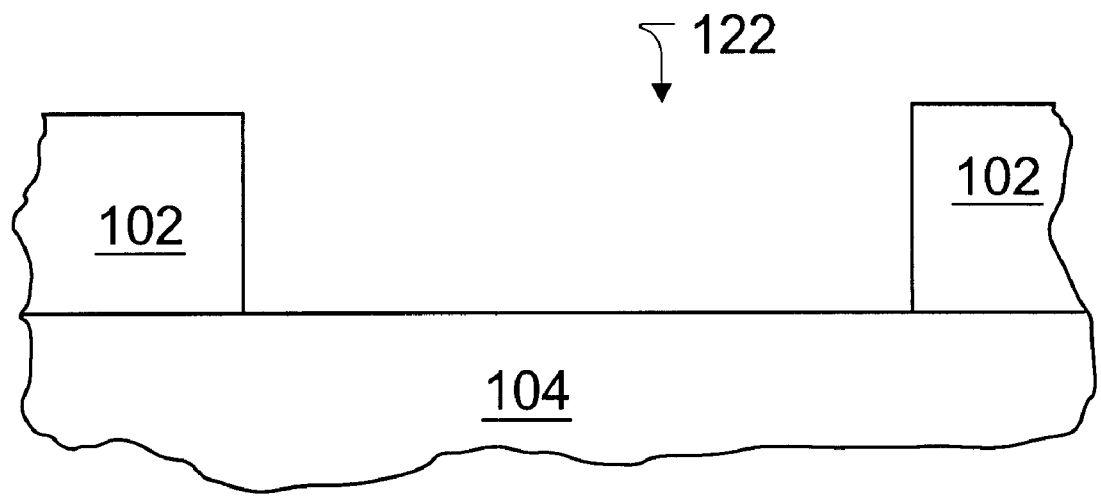
FIG. 15 is a sectional view taken along the line 15—15 of FIG. 12.

FIG. 12 shows an opening in the form of a trench 100 in a dielectric layer 102 which overlies a silicon layer 104, the trench 100 having a configuration in accordance with a first embodiment of the present invention. The trench 100 comprises generally elongated trench portions 106, 108, 110, 112 connected by trench corner regions 114, 116, 118, 120. Each trench portion is made up of a plurality of connected trench legs 122 which are substantially perpendicular to each other at their connections. In addition, the legs 122 are of similar width and length. Cross-sections of a trench leg 122 are shown in FIGS. 14 and 15. A typical trench leg 122 would for example be 1 $\mu$m in width (FIG. 14) and 5 $\mu$m in length (FIG. 15). Thus, the trench 100 contains no long, continuous, straight portions.

The trench 100 may readily be fabricated by using cells 124, 126 in the form show in FIGS. 12A and 12B. A step-and-repeat process would be used to replicate the cell shown in FIG. 12A along substantially the entire length of each portion of the trench 100. A step and repeat process would also be used to replicate the cell 126 shown in FIG. 12B to form the corners 114, 116, 118, 120 of the trench 100.

FIG. 13 shows a trench 100A in a dielectric layer 102A and having a configuration in accordance with a second embodiment of the invention. The trench 100A again comprises generally elongated trench portions 106A, 108A, 110A, 112A, connected by corner regions 114A, 116A, 118A, 120A. Each trench portion is again made up of a plurality of connected trench legs 122A which are substantially perpendicular to each other at their connections. However, these legs 122A are positioned in a zigzag configuration, rather than in the step configuration of FIG. 12.

Again, the legs 122A are of similar width and length. The cross-sections shown in FIGS. 14 and 15 are representative of the cross-sections of these trench legs 122A. Similar to the embodiment of FIG. 12, a typical trench leg length would for example be 1 $\mu$m in width and 5 $\mu$m in length. It will be again seen that the trench 100A contains no long, continuous portions.

The trench 100A may readily be fabricated by using the cell 127 in the form shown in FIG. 13A. A step-and-repeat process would be used to replicate the cell shown in FIG. 13A about the entire trench 100A.

In the following discussion, reference is made to the embodiment of trench 100 shown in FIG. 12. However, and it will be readily seen that the following discussion and all method steps shown and described therein apply equally to the embodiment shown in FIG. 13.

Figure 16:
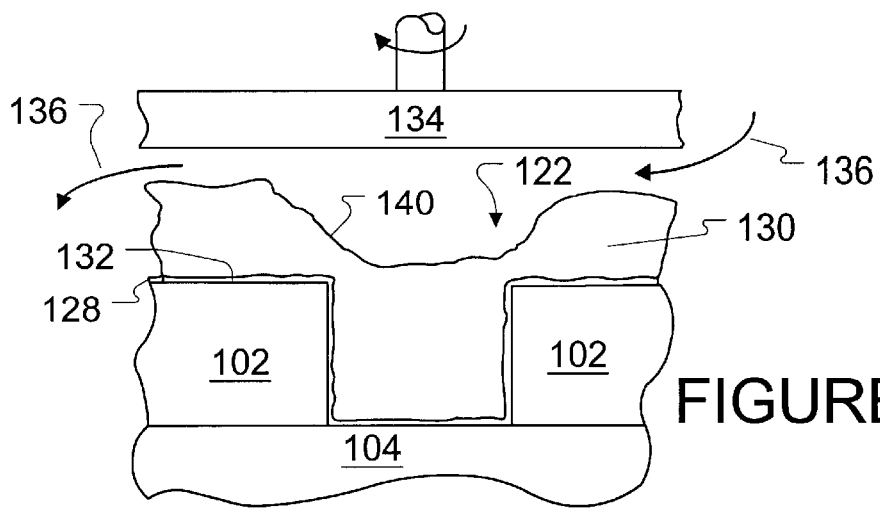
FIG. 16 is a sectional view similar to the shown in FIG. 14, illustrating a step in the chemical-mechanical polishing process.
Figure 17:
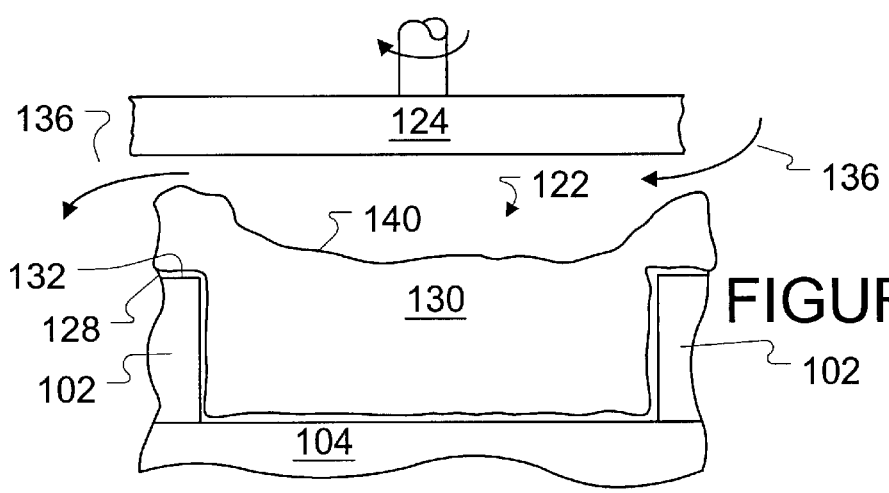
FIG. 17 is a sectional view similar to that shown in FIG. 16, illustrating a step in the chemical-mechanical polishing process.

With reference to FIGS. 16 and 17, after deposition of a barrier diffusion layer 128 over the dielectric layer 102 and in the trench leg 122 and in contact with the silicon layer 104, copper or copper alloy or other conductive metal 130 is electrolessly deposited thereover. Typically, the metal 130 in the opening 122 extends above the upper surface 132 of the dielectric layer 102, and is even high over the upper surface 132 of the dielectric layer 102.

A chemical-mechanical polishing step is undertaken using polishing pad 134 and slurry 136. The pad 134, being somewhat compliant, to an extent conforms to the configuration of the top surface 140 of the metal 130, meanwhile applying maximum pressure to the highest portions of the metal 130.

Figure 18:
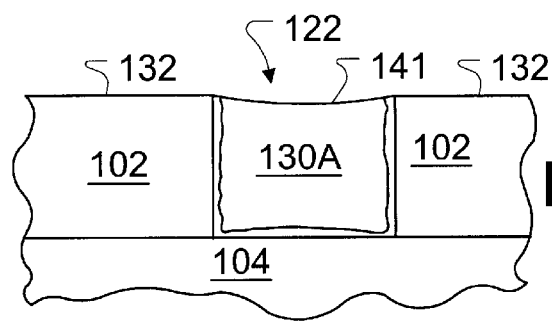
FIG. 18 is a sectional view similar to that shown in FIG. 16, illustrating a further step in the chemical-mechanical polishing process.
Figure 19:
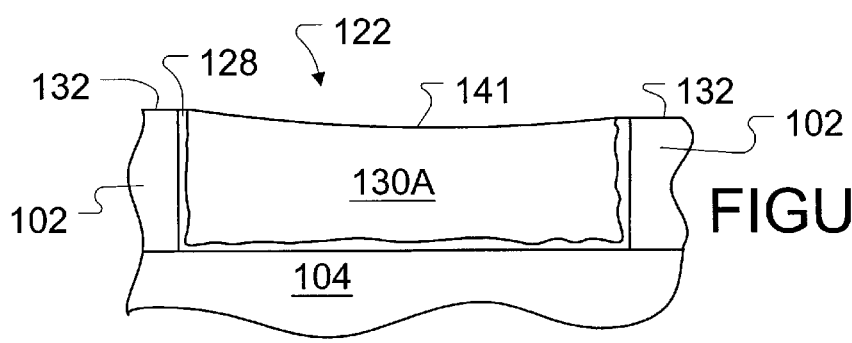
FIG. 19 is a sectional view similar to that shown in FIG. 17, illustrating a further step in chemical-mechanical polishing process.

After sufficient chemical-mechanical polishing, all metal over the dielectric layer 102 is removed, and the level of metal 130A is brought down so that the top surface 141 thereof is substantially coplanar with the top surface 132 of the dielectric 102 (FIGS. 18 and 19). Thus, an edge seal structure 142 generally in the form of a continuous ring, surrounding an active area 144, is fabricated (FIG. 20). It will be seen that the edge seal structure 142 is made up of sections 146, 148, 150, 152 connected by corner regions 154, 156, 158, 160, with each section made up of a plurality of connected segments 162, which segments 162 are of similar length and which are perpendicular, i.e. at right angles, to each other at their connections.

Figure 1:
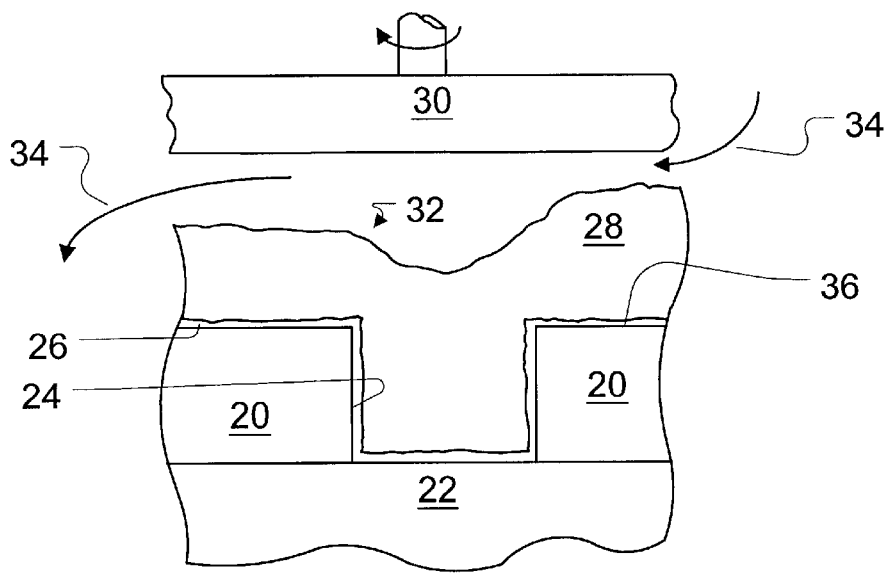
FIG. 1 is a sectional view illustrating the step of chemical-mechanical polishing in the formation of a via.
Figure 2:
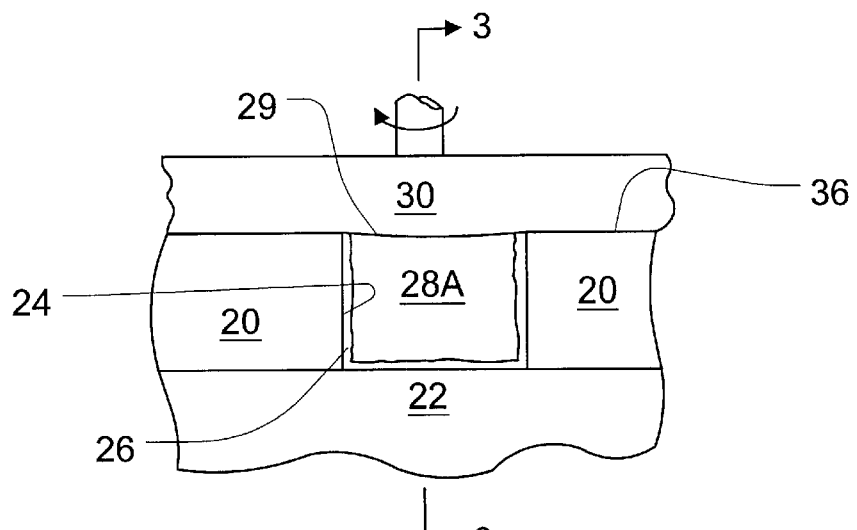
FIG. 2 is a sectional view similar to that shown in FIG. 1, illustrating a further step in the chemical-mechanical polishing process.
Figure 3:
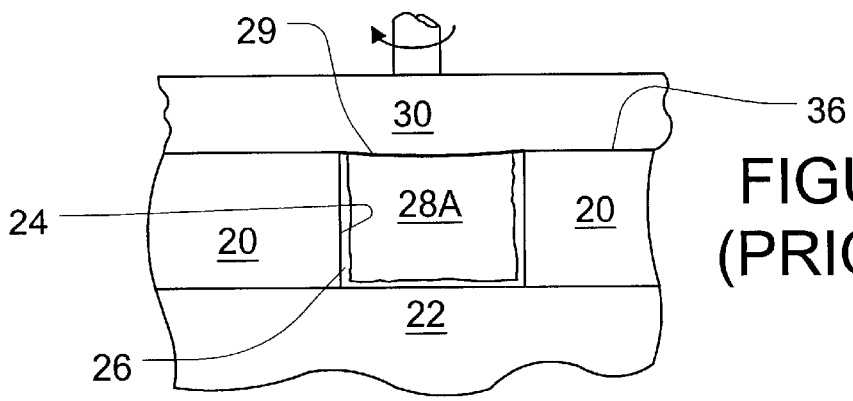
FIG. 3 is a sectional view taken along the line 3—3 of FIG. 2.
Figure 4:
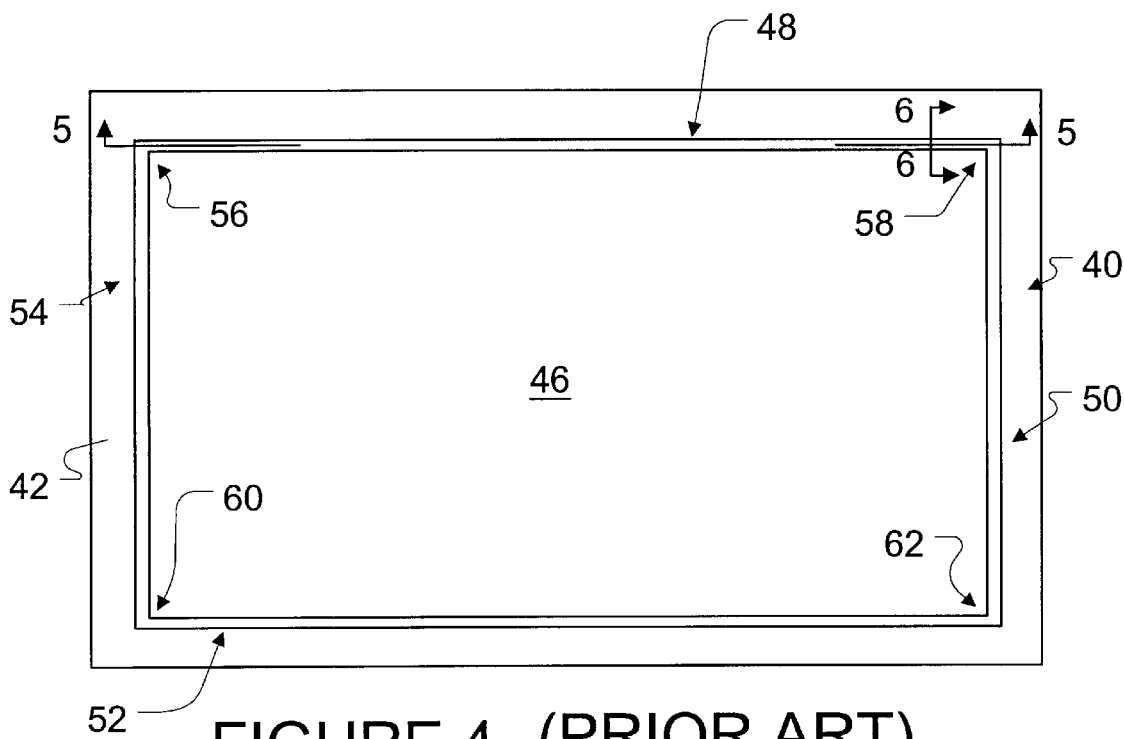
FIG. 4 is a plan view of a device including a trench as known in the prior art.
Figure 5:
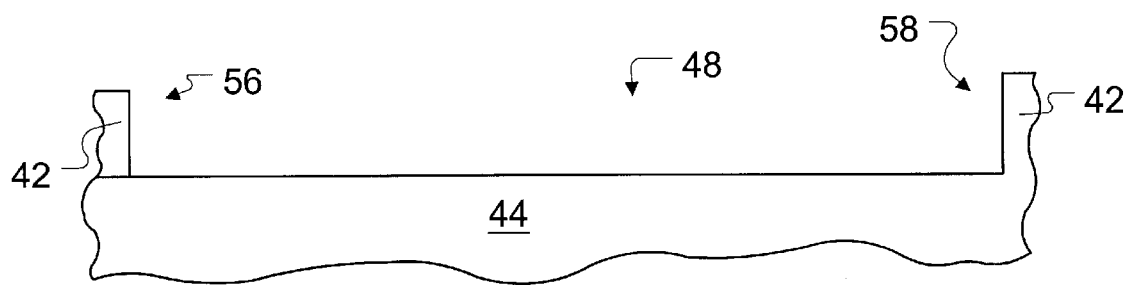
FIG. 5 is a sectional view taken along the line 5—5 of FIG. 4.
Figure 6:
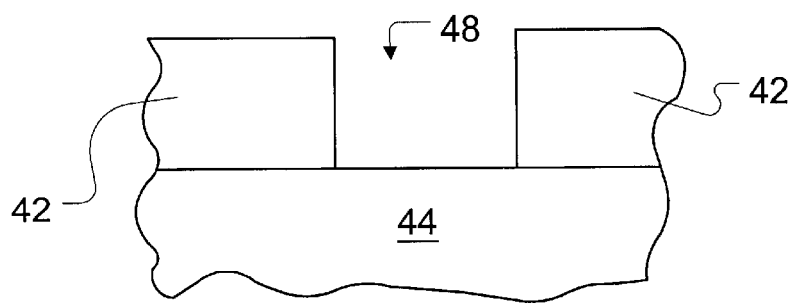
FIG. 6 is a sectional view taken along the line 6—6 of FIG. 4.
Figure 7:
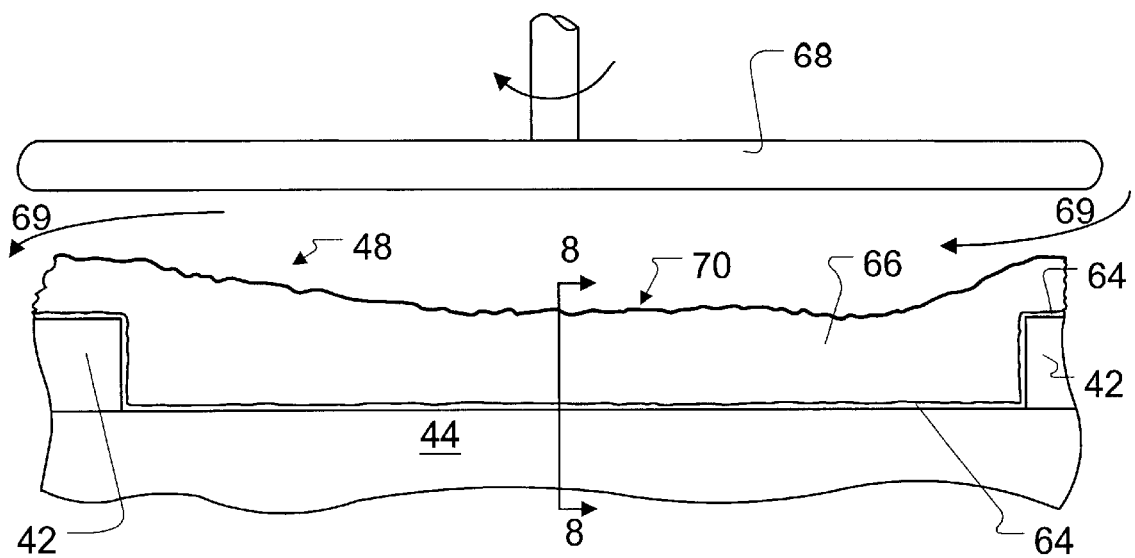
FIG. 7 is a sectional view similar to that shown in FIG. 5, and illustrating a step in the chemical-mechanical polishing process.
Figure 8:
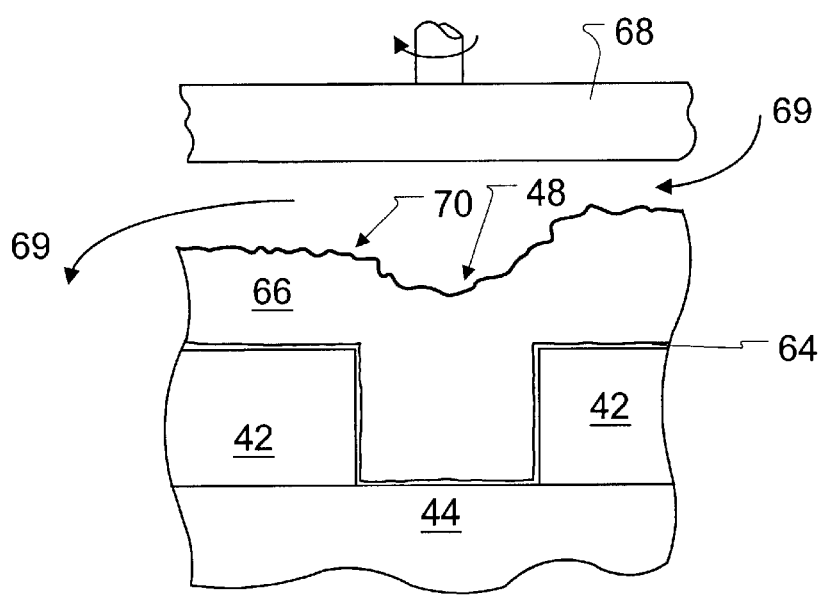
FIG. 8 is a sectional view taken along the line 8—8 of FIG. 7.

Because the distance between the portions of dielectric layer 102 across the opening 122 is so small (for example approximately 5 µm as indicated in FIG. 15, and 1 µm as indicated in FIG. 16), the polishing pad 134, when it reaches the dielectric layer 102, is supported thereby over a relatively short span across the opening 122 so that significant cupping of the metal in the trench leg 122 is avoided. Furthermore, the short segments 162 of the present invention are readily filled with metal during fabrication of the edge seal structure 142. This is to be compared with the prior art trench 40 (and thus the edge seal ring) having long, continuous, straight portions, leading to the problems discussed above.

When the method is applied to the device having the trench configuration of FIG. 13, a seal structure 142A generally in the form of a continuous ring, surrounding an active area 144A, is fabricated (FIG. 21). It will be seen that the edge seal structure 142A is made up of a plurality of connected segments 162A which are of similar length, and which are perpendicular, i.e., at right angles, to each other at their connections. These sections 162A are in a zigzag configuration, rather than a step configuration as in the previous embodiment. However, all the features of the previous embodiment apply to this embodiment.

It will be understood that the drawing configurations have been chosen to more clearly illustrate the features of the invention. That is, for example, in reality, the number of segments of the edge seal ring are much greater than that illustrated, and the width and length of the segments are adjusted from their actual size for greater clarity.

The foregoing description of the embodiments of the invention has been presented for purposes of illustration and description. It is not intended to be exhaustive or to limit the invention to the precise form disclosed. Other modifications or variations are possible in light of the above teachings.

The embodiments were chosen and described to provide the best illustration of the principles of the invention and its practical application to thereby enable one of ordinary skill of the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. An edge seal structure for a semiconductor device comprising a plurality of sections connected by corner regions, at least one section comprising a plurality of connected segments, wherein at least a pair of adjacent connected segments are non-aligned.

2. The edge seal structure of claim 1 wherein the edge seal structure is a continuous ring.

3. The edge seal structure of claim 1 wherein each section of the edge seal structure comprises a plurality of connected segments, wherein at least a pair of adjacent connected segments of each section are non-aligned.

4. The edge seal structure of claim 1 wherein the edge seal structure comprises metal.

5. The edge seal structure of claim 1 wherein the edge seal structure comprises copper.

6. The edge seal structure of claim 1 wherein the edge seal structure comprises copper alloy.

7. The edge seal structure of claim 1 wherein the pair of adjacent connected segments are substantially perpendicular.

8. The edge seal structure of claim 1 wherein the pair of adjacent connected segments are of similar length.

9. An edge seal structure for a semiconductor device comprising a plurality of sections connected by corner regions, each section comprising a plurality of connected segments, wherein the adjacent connected segments of each section are non-aligned.

10. The edge seal structure of claim 9 wherein at least some of the adjacent segments are substantially perpendicular.

11. The edge seal structure of claim 10 wherein at least some of the segments of each section are of similar length.

12. The edge seal structure of claim 11 and further comprising the step of providing that the edge seal structure is a continuous ring.

13. The edge seal structure of claim 12 wherein the edge seal structure comprises metal.

14. The edge seal structure of claim 12 wherein the edge seal structure comprises copper.

15. The edge seal structure of claim 12 wherein the edge seal structure comprises copper alloy.

* * * * *